(12) United States Patent
Faes et al.

(10) Patent No.: US 12,191,402 B2
(45) Date of Patent: Jan. 7, 2025

(54) METHOD OF MANUFACTURING A SEMICONDUCTOR TRANSDUCER DEVICE WITH MULTILAYER DIAPHRAGM AND SEMICONDUCTOR TRANSDUCER DEVICE WITH MULTILAYER DIAPHRAGM

(71) Applicant: Sciosense B.V., AE Eindhoven (NL)

(72) Inventors: Alessandro Faes, Premstätten (AT); Jörg Siegert, Graz (AT); Willem Frederik Adrianus Besling, JN Eindhoven (NL); Remco Henricus Wilhelmus Pijnenburg, AE Hoogeloon (NL)

(73) Assignee: Sciosense B.V., AE Eindhoven (NL)

( * ) Notice: Subject to any disclaimer, the term of this patent is extended or adjusted under 35 U.S.C. 154(b) by 639 days.

(21) Appl. No.: 17/288,847

(22) PCT Filed: Oct. 24, 2019

(86) PCT No.: PCT/EP2019/079068
§ 371 (c)(1),
(2) Date: Apr. 26, 2021

(87) PCT Pub. No.: WO2020/094412
PCT Pub. Date: May 14, 2020

(65) Prior Publication Data
US 2021/0359143 A1    Nov. 18, 2021

(30) Foreign Application Priority Data
Nov. 7, 2018 (EP) .................................. 18205008

(51) Int. Cl.
*H01L 29/84* (2006.01)
*H01L 21/306* (2006.01)
*H01L 21/768* (2006.01)

(52) U.S. Cl.
CPC ........ *H01L 29/84* (2013.01); *H01L 21/30625* (2013.01); *H01L 21/76843* (2013.01)

(58) Field of Classification Search
CPC ............ B81C 1/00158; B81C 1/00246; B81C 2201/0167; B81C 2201/0108;
(Continued)

(56) References Cited

U.S. PATENT DOCUMENTS 5,573,679 A    11/1996  Mitchell et al.
9,416,004 B2    8/2016  Fu et al.
(Continued)

FOREIGN PATENT DOCUMENTS

CN    103873010 A    6/2014
CN    104427447 A    3/2015
(Continued)

*Primary Examiner* — Ali Naraghi
*Assistant Examiner* — E. Rhett Cheek
(74) *Attorney, Agent, or Firm* — Slater Matsil, LLP

(57) ABSTRACT

In an embodiment a method includes providing a semiconductor body, forming a sacrificial layer above a surface of the semiconductor body, applying a diaphragm on the sacrificial layer and removing the sacrificial layer by introducing an etchant into openings of the diaphragm, wherein applying the diaphragm comprises applying a first layer, reducing a roughness of a surface of the first layer facing away from the semiconductor body thereby providing a processed surface, and patterning and structuring the first layer to form the openings.

10 Claims, 2 Drawing Sheets

(58) Field of Classification Search
CPC .... B81C 2201/0109; B81B 2201/0264; B81B 2203/0127
See application file for complete search history.

(56) References Cited

U.S. PATENT DOCUMENTS

| | | | |
|---|---|---|---|
| 9,772,245 B2* | 9/2017 | Besling | G01L 9/0045 |
| 9,955,949 B2 | 5/2018 | Torashima et al. | |
| 2004/0245586 A1* | 12/2004 | Partridge | B81C 1/00301 |
| | | | 438/48 |
| 2010/0132467 A1* | 6/2010 | Ko | G01P 1/023 |
| | | | 73/514.32 |
| 2010/0330722 A1* | 12/2010 | Hsieh | G01P 15/125 |
| | | | 257/E21.211 |
| 2011/0073967 A1* | 3/2011 | Chen | H04R 19/005 |
| | | | 257/416 |
| 2012/0256237 A1* | 10/2012 | Lakamraju | G01L 9/0073 |
| | | | 257/254 |
| 2013/0328142 A1* | 12/2013 | Nackaerts | B81B 7/008 |
| | | | 438/53 |
| 2013/0334626 A1* | 12/2013 | Weber | B81C 1/00158 |
| | | | 438/51 |
| 2014/0210018 A1 | 7/2014 | Dawson et al. | |
| 2016/0023893 A1 | 1/2016 | Besling et al. | |
| 2016/0264399 A1* | 9/2016 | Cheng | B81B 3/0021 |
| 2017/0210617 A1* | 7/2017 | Sadaka | B81B 1/002 |
| 2020/0137501 A1 | 4/2020 | Piechocinski | |

FOREIGN PATENT DOCUMENTS

| | | |
|---|---|---|
| CN | 104795311 A | 7/2015 |
| CN | 105336572 A | 2/2016 |
| TW | 201838908 A | 11/2018 |

* cited by examiner

METHOD OF MANUFACTURING A SEMICONDUCTOR TRANSDUCER DEVICE WITH MULTILAYER DIAPHRAGM AND SEMICONDUCTOR TRANSDUCER DEVICE WITH MULTILAYER DIAPHRAGM

This patent application is a national phase filing under section 371 of PCT/EP2019/079068, filed Oct. 24, 2019, which claims the priority of European patent application 18205008.8, filed Nov. 7, 2018, each of which is incorporated herein by reference in its entirety.

TECHNICAL FIELD

A diaphragm of a semiconductor transducer device, like a pressure sensor, can comprise a sequence of layers including a main metal layer. The diaphragm, for example a MEMS membrane, is applied on a sacrificial layer. A layer of TiN/Ti or TiN may be arranged between the main metal layer and the sacrificial layer to facilitate adhesion and to provide a diffusion barrier and stress compensation, and a layer of TiN may also be arranged on the main metal layer. The sacrificial layer is afterwards removed to release the diaphragm, in particular by hydrofluoric, HF, vapor etching. The membrane may be prone to breakage after release, which may impair the yield of functional devices.

BACKGROUND

U.S. Patent Publication No. 2016/0023893 A1 discloses a suspended membrane for a capacitive pressure sensor, which comprises depositing a first electrically conductive material above a sacrificial layer and within a boundary trench, removing at least a portion of uneven topography of the first electrically conductive material, depositing a second electrically conductive material extending beyond the boundary trench, and removing the sacrificial layer through etch openings.

SUMMARY

Embodiments provide an improved concept for manufacturing a semiconductor transducer device with a multilayer diaphragm that secures mechanical stability after etch release.

The improved concept is based on the idea of providing a fabrication process of a semiconductor transducer device, in which manufacturing a suspended diaphragm includes forming a first layer of the diaphragm and in a subsequent step preparing a processed surface of the first layer with predefined smoothness. A second layer of the diaphragm may be applied on the processed surface of the first layer.

The method according to the improved concept comprises providing a semiconductor body, forming a sacrificial layer above a surface of the semiconductor body and applying a diaphragm on the sacrificial layer. The diaphragm is a MEMS membrane, for example, which may be structured, e.g. perforated. The method further comprises removing the sacrificial layer by introducing an etchant, such as HF vapor, into openings of the diaphragm. Applying the diaphragm according to the improved concept comprises applying a first layer, reducing a roughness of a surface of the first layer facing away from the semiconductor body in order to achieve a processed surface, and patterning and structuring the first layer to form the openings.

The deposition of some materials occurs in a fashion that results in surfaces of the deposited layer characterized by significant roughness. Notches on these surfaces may have a high negative impact on the yield of finalized devices, as the notches may act as fracture initiation sites. Also, an inhomogeneous stress distribution across the deposited layer may result in unstable conditions of suspended components of the finalized device. For semiconductor transducer devices, these effects may lead to a low yield of the manufacturing process due to collapsing or breaking of the suspended diaphragm during or after its release, i.e. during or after the removal of the sacrificial layer.

Implementing into the manufacturing method a step in which after deposition of the first layer the top surface, i.e. the surface of the first layer facing away from the semiconductor body, is processed in a manner that reduces its roughness to a predefined value, may significantly reduce the aforementioned effects and hence lead to a high yield of the manufacturing process.

The semiconductor body may comprise active circuitry of an application-specific integrated circuit, ASIC, which is arranged on or within a substrate, such as a silicon substrate.

The first layer of the diaphragm may be regarded as the main layer of the diaphragm. The main layer of a diaphragm may for example constitute a top electrode of a semiconductor transducer that is configured as a capacitive transducer. Top electrode in this context refers to the electrode of a capacitive transducer that is arranged at a larger distance from the semiconductor body than the other electrode, which may in turn be referred to as bottom electrode.

In some embodiments, the diaphragm is applied on a substantially flat surface of the sacrificial layer. In other words, the sacrificial layer has no topographic features from subjacent layers, for instance.

In some embodiments, reducing the roughness comprises a polishing process, such as chemical-mechanical polishing, CMP.

Chemical-mechanical polishing processes may be used to significantly reduce a roughness of a surface, such as a surface of a deposited material. While unprocessed surfaces may have a roughness profile with an arithmetic mean, $R_a$, in the order of tens of nanometers, processed surfaces after a CMP treatment show a significantly reduced roughness with a roughness $R_a$ in the order of a few nanometers down to the Angstrom level.

In some embodiments, the processed surface has a roughness profile with arithmetic average between 2 nm and 10 nm, for example equal to or smaller than 5 nm.

Surfaces of specific layers can be examined at various stages during the fabrication process. Methods to assess surface roughness include profilometry using optical or contact profilometers, such as atomic force microscopes, and cross section imaging by means of a scanning electron microscope, for instance. Measurements of the roughness profile of the deposited first layer show that the roughness of the unprocessed top surface is characterized by a $R_a$ of around 18 nm, which leads to a low production yield due to the above-mentioned consequences. A reduction of this value to about 5 nm is achieved by a specific CMP process, for example, and leads to a significant improvement of the production yield.

Employing a specific slurry and polishing pad in combination with a timed tungsten CMP recipe aids in preventing large non-uniformities and defects and result in the desired roughness profile of 5 nm after only 10 s of polishing. Increasing the polishing time by a factor of two, for example, further reduces the roughness profile to the single-nanometer level, which may be beneficial for certain manufacturing processes.

In some embodiments, applying the first layer comprises applying a metal, such as tungsten.

A suitable choice for the material of the first layer is for example tungsten as it is compatible with CMOS fabrication processes and fulfills the requirement of being resistant to fluorine-based etching steps, such as a vapor-phase HF, vHF, etch. In addition, a metal material provides the electrical conductance required to form an electrode, such as the top electrode of a capacitive transducer device. Other suitable materials include aluminum, aluminum oxide, silicon carbide, and silicon germanium.

In some embodiments, applying the diaphragm further comprises applying a second layer. The second layer is applied on the processed surface.

The second layer may be configured as a barrier layer as a diffusion barrier and/or for stress compensation, for example. To this end, the second layer is arranged on the processed surface of the first layer, i.e. the second layer is arranged at a larger distance from the semiconductor body than the first layer. Due to the second layer being deposited on the processed surface, the surface of the second layer facing away from the semiconductor body may be characterized by a low surface roughness as well.

In some further embodiments, applying the second layer comprises applying titanium and/or titanium nitride, TiN.

Titanium, titanium nitride or a combination of these two materials constitute a suitable choice for diffusion barriers and stress balancing layers. Therefore, the second layer protecting the first layer may be chosen to comprise at least one of these materials.

In some embodiments, applying the diaphragm further comprises applying a third layer. Therein, the first layer is applied on a surface of the third layer facing away from the semiconductor body.

In these embodiments, a third layer may be arranged in between the sacrificial layer and the first layer, i.e. the third layer is applied on a surface of the sacrificial layer facing away from the semiconductor body. In case, a material of the first layer, such as tungsten, is characterized by low adhesion to a material of the sacrificial layer, an additional layer may be employed that has a significantly larger adhesion to such a sacrificial layer, which typically comprises silicon or silicon dioxide, and to which a material of the first layer adheres superiorly than to the material of the sacrificial layer.

In some further embodiments, applying the third layer comprises applying titanium and/or titanium nitride, TiN.

After removal of the sacrificial layer, the surface of the first layer facing the semiconductor body would be uncovered without a third layer. The latter may therefore, analogous to the second layer in some embodiments, serve as another barrier layer and/or for stress balancing purposes. Furthermore, especially for embodiments that comprise both a second and a third layer, the same material choice for said layers ensures a fabrication process that is kept as simple as possible due to a short list of employed materials.

In some embodiments, the method according to the improved concept further comprises applying an electrode layer between the semiconductor body and the sacrificial layer, forming vias interconnecting the electrode layer and the semiconductor body and forming further vias interconnecting the diaphragm and the semiconductor body.

In these embodiments, an electrode layer made of a metal is arranged between the semiconductor body and the diaphragm at a distance from the diaphragm, for example the electrode layer is in contact with the semiconductor body. With the electrode layer forming a structured bottom electrode of the transducer, for example, enables determining a deflection of the diaphragm via a measurement of the capacitance of a capacitor formed between the top electrode, which may be a layer of the diaphragm, and the bottom electrode. Vias, such as through-substrate-vias, TSV, may provide the electric interconnection between the two electrodes and active circuitry of the semiconductor body.

In some embodiments, the method further comprises applying a cover layer between the semiconductor body and the electrode layer.

In order to achieve electric insulation of the electrode layer from active circuitry of the semiconductor body, for example, a cover layer may be utilized. The cover layer may be a dielectric, such as silicon dioxide, $SiO_2$.

In some embodiments, the method further comprises applying an etch stop layer, ESL, arranged between the semiconductor body and the sacrificial layer.

As the suspended diaphragm of a finalized transducer device is conventionally realized by means of removing a sacrificial material in between the diaphragm and the semiconductor body, an etch stop layer may be employed in order to have a controlled ending point of the vHF etch used for removing the sacrificial material. Hence, the etch stop layer is configured to prevent over-etching during the fabrication process of the transducer device. Also, on the finalized transducer device the ESL may serve as protective layer for underlying active circuitry of the semiconductor body and/or a bottom electrode formed on top of or above the semiconductor body. The etch stop layer is of a material that has a significantly lower etch rate than the sacrificial material regarding a fluorine-based etchant. The material of the ESL is a semiconductor material, such as silicon carbide, or of a dielectric, such as silicon nitride, e.g. silicon-rich silicon nitride, for instance.

The aforementioned object is further solved by a semiconductor transducer device that comprises a semiconductor body and a diaphragm having a first layer. Therein, a main extension plane of the diaphragm is arranged parallel to a surface of the semiconductor body and the diaphragm is suspended at a distance from the semiconductor body in a direction perpendicular to the main extension plane of the diaphragm. Moreover, the first layer comprises a processed surface with a predetermined smoothness, wherein the processed surface faces away from the semiconductor body.

In some embodiments, the semiconductor body further comprises an integrated circuit.

The semiconductor transducer device may comprise an ASIC arranged on or within the semiconductor body for providing a readout of a deflection of the diaphragm, for example due to a pressure change. The readout may for example be based on a measurement of a capacitance of the transducer if the transducer device is a capacitive transducer, for instance.

Further embodiments of the semiconductor transducer device become apparent to the skilled reader from the embodiments of the manufacturing method described above.

The aforementioned object is further solved by a pressure sensor comprising a semiconductor transducer device according to one of the embodiments described above.

The pressure sensor may be configured to detect static pressure changes or dynamic pressure changes, such as pressure waves, e.g. sound waves in the acoustic frequency band. To this end, the pressure sensor may either consist of the semiconductor transducer device or may comprise further components, such as circuit components, a printed circuit board and/or a housing.

The aforementioned object is further solved by a mobile device comprising a pressure sensor with a semiconductor transducer device according to one of the embodiments described above.

Applications of the described semiconductor transducer device include compact and high-sensitivity pressure sensors or microphones that are, for example, employed in smartwatches, smartphones and tablet computers, in which the transducer device is configured to omnidirectionally detect static or dynamic pressure changes in an environment of the mobile device, for instance.

BRIEF DESCRIPTION OF THE DRAWINGS

The following description of figures of exemplary embodiments may further illustrate and explain aspects of the improved concept. Elements of the semiconductor transducer device with the same structure and the same effect, respectively, appear with equivalent reference symbols. Insofar as elements of the semiconductor transducer device correspond to one another in terms of their function in different figures, the description thereof is not repeated for each of the following figures.

DETAILED DESCRIPTION OF ILLUSTRATIVE EMBODIMENTS

Figure 1:
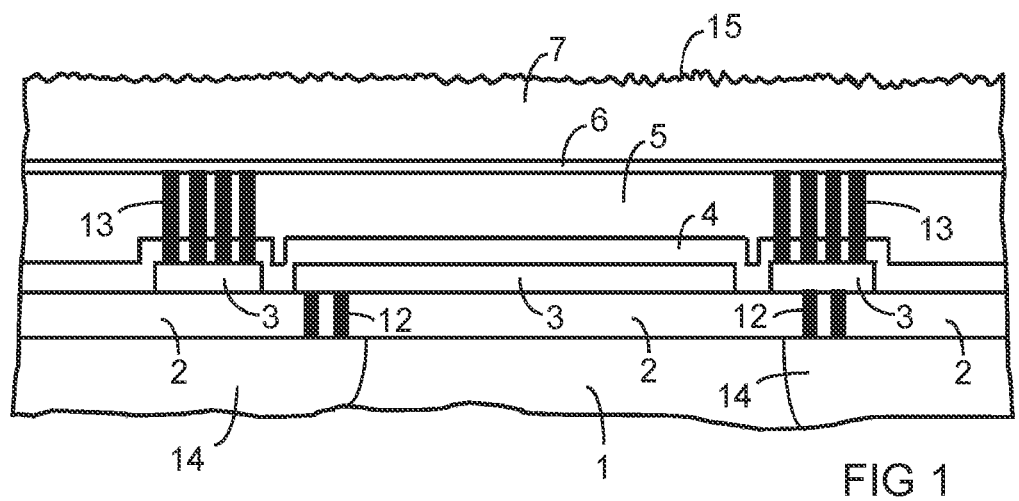
FIG. 1 shows a cross section of an intermediate product of a semiconductor transducer device after an application of a first layer of a multilayer diaphragm.

FIG. 1 is a cross section of an intermediate product of a semiconductor transducer device, which may for example be employed in a pressure sensor. The semiconductor transducer device in this embodiment comprises a semiconductor body 1 comprising a substrate 1A, which may be silicon, for instance. The semiconductor body 1 may also include an integrated circuit 14, which may in particular be a CMOS circuit with active and passive circuitry. Such integrated circuits are known per se, and details of the integrated circuit 14, which depend on an individual application, are not shown in the figures. The integrated circuit 14 may especially be provided for an evaluation of signals from the transducer, such as a capacitance of the transducer.

A cover layer 2, which may include a wiring embedded in an inter-metal dielectric layer and/or a passivation, for instance, is applied on a surface of the semiconductor body 1. The inter-metal dielectric layer may comprise silicon dioxide, and the passivation may comprise a combination of silicon dioxide and silicon nitride, for instance. The part of the semiconductor transducer device that includes the semiconductor body 1 and the cover layer 2 may be similar to a conventional semiconductor device with an integrated circuit. The semiconductor transducer device differs from such a semiconductor device by an arrangement of transducer elements on a surface of the cover layer 2 facing away from the semiconductor body 1.

An electrode layer 3 may be arranged on the surface of the cover layer 2 and patterned and structured, for example via lithography and etching, in order to form a first electrode of a transducer, especially a capacitive transducer, for instance. The first electrode of such a transducer may be referred to as the bottom electrode. An etch stop layer 4 is arranged on a surface of the structured electrode layer 3 facing away from the semiconductor body 1. A sacrificial layer 5 is arranged on a surface of the etch stop layer 4 facing away from the semiconductor body 1. The etch stop layer 4 is made of a material with a significantly lower etch rate regarding a fluorine-based etchant compared to a material of the sacrificial layer 5. For example, the etch stop layer 4 comprises silicon nitride, such as silicon-rich silicon nitride, while the sacrificial layer comprises silicon or silicon dioxide.

The diaphragm 10 is arranged on a surface the sacrificial layer 5 facing away from the semiconductor body 1. The diaphragm 10 comprises a sequence of layers and may particularly include a first layer 7 and a third layer 6. The third layer 6 may be provided as a barrier layer and/or may facilitate the arrangement of the diaphragm 10 on the sacrificial layer 5. A material of the third layer 6 may be characterized by a larger adhesion to the sacrificial layer 5 compared to a material of the first layer 7. The third layer 6 may for example comprise titanium, titanium nitride, TiN, or a combination of titanium and TiN.

The first layer 7 of the diaphragm 10 may comprise a metal, which may e.g. be tungsten. The first layer 7 may be a uniform or homogeneous layer or a sequence of at least two individual layers of different materials. The first layer 7 may be referred to as the main layer of the diaphragm 10, for example constituting an upper electrode of a capacitive transducer device. In particular, the FIG. 1 shows the intermediate product of the semiconductor transducer device after applying the first layer 7, wherein an unprocessed surface 15 of the first layer 7 that is facing away from the semiconductor body 1 is characterized by a significant roughness, for example having a roughness profile with an arithmetic mean, $R_a$, of around 20 nm.

Vertical electric interconnections 12 may be provided to connect the electrode layer 3 with terminals of circuitry of the semiconductor body 1. For example, these interconnections are realized by vias, such as through-substrate-vias, TSV. Further vertical electric interconnections 13 may be provided by further vias to interconnect the diaphragm 10, e.g. a top electrode formed by the third layer 7, with further terminals of circuitry of the semiconductor body 1.

Figure 2:
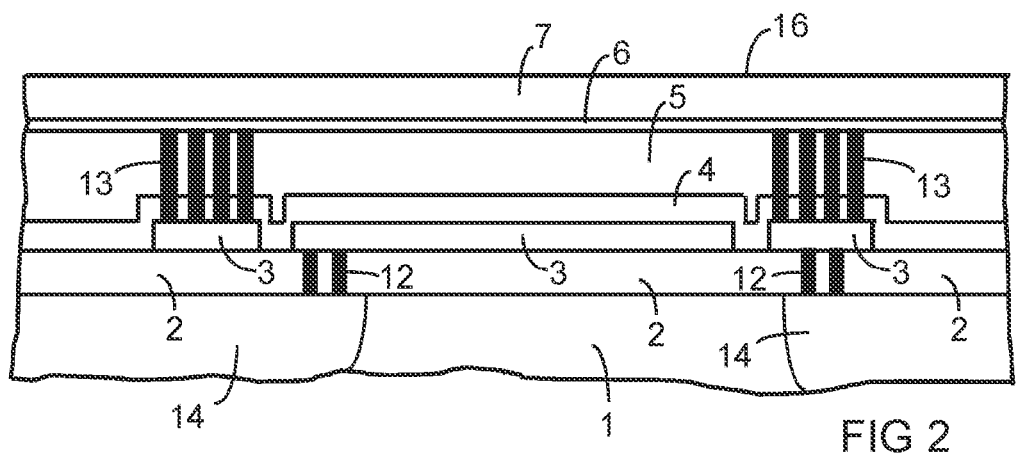
FIG. 2 shows a cross section according to FIG. 1 after a step that reduces a roughness of a surface of the first layer.

FIG. 2 is a cross section according to FIG. 1 after reducing a roughness of the surface 15 of the first layer 7. Elements of the intermediate product shown in FIG. 2 that correspond to elements of the intermediate product shown in FIG. 1 are designated with the same reference numerals. Subsequent to applying the first layer 7, a roughness of its top surface 15, i.e. the surface facing away from the semiconductor body 1, is substantially reduced by a chemical-mechanical polishing, CMP, step that yields a processed surface 16 with predetermined smoothness. The CMP step improves the fabrication yield, as a multilayer diaphragm with reduced and predetermined surface roughness is less prone to fracture. The polishing step also helps to enhance the overall stress balance in the layer stack forming the diaphragm. It has been shown that reducing the surface roughness to Ra of around 5 nm already significantly improves the production yield of the transducer device. Using an appropriate slurry and polishing pad, this value can be achieved by employing a 10 s timed W CMP process.

Figure 3:
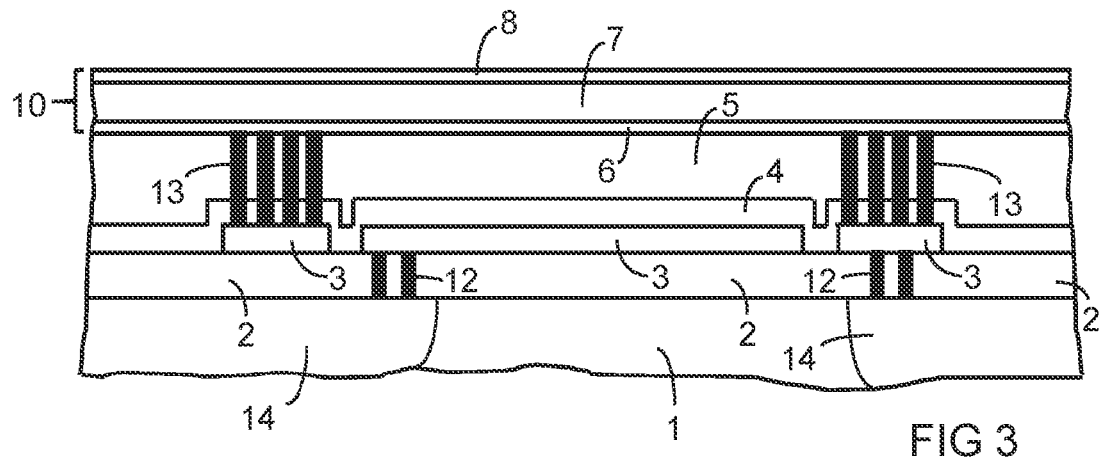
FIG. 3 shows a cross section according to FIG. 2 after an application of a second layer of the diaphragm.

FIG. 3 is a cross section according to FIG. 2 after an application of a second layer 8 of the diaphragm 10. Elements of the intermediate product shown in FIG. 3 that correspond to elements of the intermediate product shown in FIG. 2 are designated with the same reference numerals. Due to the processed surface 16 of the first layer, the application of the second layer 8 is substantially improved, i.e. the surface of the second layer 8 facing away from the semiconductor body 1 is likewise characterized by a reduced roughness compared to an application of the second layer on an unprocessed surface 15.

Figure 4:
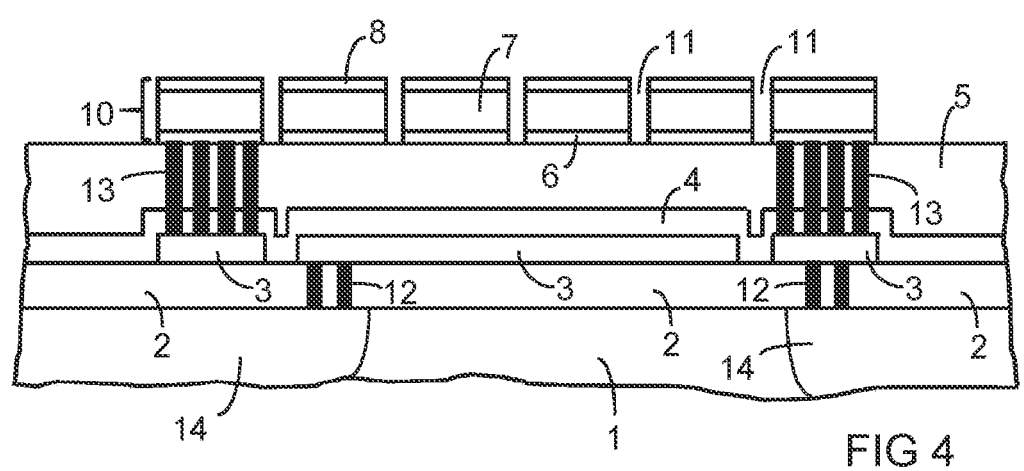
FIG. 4 shows a cross section according to FIG. 3 after the formation of openings in the diaphragm.

FIG. 4 is a cross section according to FIG. 3 after the formation of openings in the diaphragm 10. Elements of the intermediate product shown in FIG. 4 that correspond to elements of the intermediate product shown in FIG. 3 are designated with the same reference numerals. FIG. 4 shows said openings 11 in the diaphragm 10. The openings 11 are provided for a subsequent etching step, wherein an etchant is introduced in the openings 11 to attack and remove the material of the sacrificial layer 5.

Figure 5:
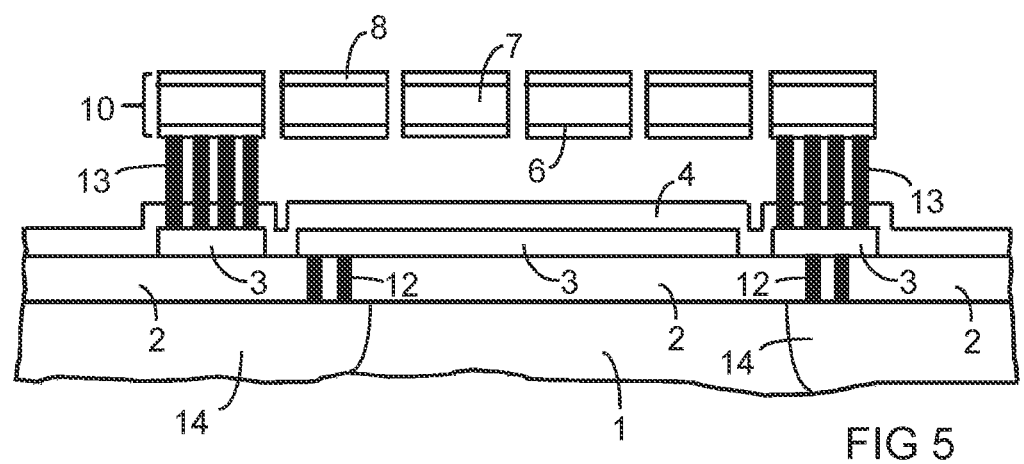
FIG. 5 shows a cross section according to FIG. 4 after release of the diaphragm.

FIG. 5 is a cross section according to FIG. 4 after the removal of the sacrificial layer 5, i.e. the embodiment of FIG. 5 may be regarded as the finalized transducer device. Elements of the intermediate product shown in FIG. 5 that correspond to elements of the intermediate product shown in FIG. 4 are designated with the same reference numerals. The sacrificial layer 5 can completely be removed. Alternatively, residues of the sacrificial layer 5 remain in between the further vias 13. The etching process stops on the etch stop layer 4. FIG. 5 shows the transducer device with the major portion of the diaphragm 10 released, so that the diaphragm 10 is suspended above the semiconductor body 1 and is free to deflect in response to an external cause, in particular when a pressure is applied. The diaphragm 10 may be connected to the semiconductor body 1 only by means of the further vias 13. Alternatively, the diaphragm 10 may be connected to the semiconductor body 1 by means of a clamping structure, for example.

The embodiments shown in the FIGS. 1 to 3 as stated represent exemplary embodiments of the semiconductor transducer device, therefore they do not constitute a complete list of all embodiments according to the improved concept. Actual transducer device configurations may vary from the embodiments shown in terms of shape, size and materials, for example.

The invention claimed is:

1. A method for producing a semiconductor transducer device, the method comprising:
   providing a semiconductor body;
   forming a sacrificial layer above a surface of the semiconductor body;
   applying a diaphragm on the sacrificial layer; and
   removing the sacrificial layer by introducing an etchant into openings of the diaphragm,
   wherein applying the diaphragm comprises:
      applying a first layer comprising tungsten, wherein the first layer is a layer of a finished diaphragm with a largest thickness,
      reducing a roughness of a surface of the first layer facing away from the semiconductor body thereby providing a processed surface, and
      patterning and structuring the first layer to form the openings,
   wherein applying the diaphragm comprises applying a third layer comprising at least one of titanium or titanium nitride,
   wherein the first layer is applied on a surface of the third layer facing away from the semiconductor body, and
   wherein the processed surface has a roughness profile with an arithmetic average between 2 nm and 10 nm inclusive.

2. The method according to claim 1, wherein reducing the roughness comprises polishing with a chemical-mechanical polishing (CMP).

3. The method according to claim 1, wherein applying the diaphragm further comprises applying a second layer on the processed surface.

4. The method according to claim 3, wherein applying the second layer comprises applying titanium and/or titanium nitride.

5. The method according to claim 1, wherein applying the third layer comprises applying titanium and/or titanium nitride.

6. The method according to claim 1, further comprising:
   applying an electrode layer between the semiconductor body and the sacrificial layer;
   forming vias interconnecting the electrode layer and the semiconductor body; and
   forming further vias interconnecting the diaphragm and the semiconductor body.

7. The method according to claim 6, further comprising applying a cover layer between the semiconductor body and the electrode layer.

8. The method according to claim 1, further comprising applying an etch stop layer between the semiconductor body and the sacrificial layer.

9. The method according to claim 1, wherein the diaphragm is applied on a substantially flat surface of the sacrificial layer.

10. A method of producing a semiconductor transducer device, the method comprising:
   providing a semiconductor body;
   forming a sacrificial layer above a surface of the semiconductor body;
   applying a diaphragm on the sacrificial layer; and
   removing the sacrificial layer by introducing an etchant into openings of the diaphragm,
   wherein applying the diaphragm comprises:
      applying a third layer comprising at least one of titanium or titanium nitride,
      applying a first layer comprising tungsten, wherein the first layer is a layer of a finished diaphragm with a largest thickness, and wherein the first layer is applied on a surface of the third layer facing away from the semiconductor body,
      reducing a roughness of a surface of the first layer facing away from the semiconductor body thereby providing a processed surface, wherein the processed surface has a roughness profile with arithmetic average between 2 nm and 10 nm inclusive, and
      patterning and structuring the first layer to form the openings.

* * * * *